United States Patent [19]

Abe et al.

[11] Patent Number: 5,298,328
[45] Date of Patent: Mar. 29, 1994

[54] PACKING MATERIAL AND METHOD OF MAKING SAME

[75] Inventors: Hajime Abe; Tsutomu Nishiwaki; Yoji Nagano, all of Tokyo, Japan

[73] Assignee: Toshiba Ceramics Co., Ltd., Tokyo, Japan

[21] Appl. No.: 743,514

[22] Filed: Aug. 12, 1991

[30] Foreign Application Priority Data

Aug. 10, 1990 [JP] Japan .................... 2-212120

[51] Int. Cl.$^5$ .............................. B32B 5/16
[52] U.S. Cl. ................... 428/403; 523/209; 523/216; 428/391
[58] Field of Search ......... 525/216, 443, 446; 428/391, 266, 268, 403; 523/443, 440, 209, 216

[56] References Cited

U.S. PATENT DOCUMENTS

| | | | |
|---|---|---|---|
| 2,563,288 | 8/1951 | Steinman | 428/391 |
| 2,643,964 | 6/1953 | Johannsen | 428/266 |
| 2,649,396 | 8/1953 | Witt et al. | 428/268 |
| 2,683,097 | 7/1954 | Biefeld | 428/268 |
| 2,723,210 | 11/1955 | Biefeld | 428/391 |
| 2,974,062 | 3/1961 | Collier | 523/466 |
| 3,773,708 | 11/1973 | Takahashi et al. | 523/209 |
| 4,452,909 | 6/1984 | Yang | 502/69 |
| 4,677,026 | 6/1987 | Hamamoto et al. | 428/404 |
| 4,766,156 | 8/1988 | Hamamoto et al. | 523/440 |
| 5,049,596 | 9/1991 | Fujimoto et al. | 523/443 |
| 5,051,209 | 9/1991 | Mirabeau et al. | 523/443 |
| 5,064,881 | 11/1991 | Togashi et al. | 523/443 |

Primary Examiner—Patrick J. Ryan
Assistant Examiner—N. Edwards
Attorney, Agent, or Firm—Foley & Lardner

[57] ABSTRACT

A packing material for sealing electronic devices having improved, higher thermal conductivity than amorphous silica-containing packing material. The packing material comprises a thermosetting resin and a filler particle comprising a core inorganic particle and an amorphous silica coating on the core particle. The core particle is made from material having a thermal conductivity higher than that of amorphous silica, for example, a metal nitride such as aluminum nitride or silicon nitride, or a metal oxide such as aluminum oxide, or crystalline silicon dioxide. The amorphous silica coating may be formed by hydrolysis of alkoxysilane.

5 Claims, 1 Drawing Sheet

PACKING MATERIAL AND METHOD OF MAKING SAME

BACKGROUND OF THE INVENTION

1. Field of the Invention

This invention relates to a packing material comprising a thermosetting resin and a particulate filler, and to a method of making the packing material. More specifically, the present invention relates to a packing material for sealing an electric device such as an integrated circuit (IC), a large scale integrated circuit, transistor, etc., and relates to a method for making the packing material. These electronic devices are mainly manufactured from silicon wafers. After printing an electronic circuit pattern, the silicon wafer is brought into a dicing process wherein the wafer is cut into individual chips. Then the chip is mounted to a base, and terminals are bonded onto the base. The electronic devices can work after bonding, but usually the chip is sealed by a packing material for protection. There are some existing methods and materials for sealing (packaging) the chip. For example, one method involves covering the chip with a metal casing, whereas in another the chip is entirely covered with a material having fluidity under specified conditions, such as glass, ceramics or resin. The present invention particularly relates to a packing material comprising thermosetting resin and filler particles.

2. Description of Related Art

In one of the conventional methods for sealing (packaging) an electronic device, a material comprising a thermosetting resin (e.g., epoxy resin) and inorganic filler particles dispersed into the resin is used as the packing material. Filler particle is used to decrease stress when the resin hardens, to increase the strength of the package and to improve the thermal conductivity. As a component of the filler particle, amorphous silica is used because of its excellent properties such as high electric insulation, heat resistance, low thermal expansion and affinity for thermosetting organic resins. (Hereinafter "silica" is referred to as "amorphous silica" or "amorphous silicon dioxide.") In addition, relatively pure silica can be prepared easily by synthetic methods or by purifying silica-containing material. Normally, silica particles used as filler will have a diameter of from about 1 μm to about 100 μm, depending upon the size of the package to be made.

The packing material can be manufactured by the following process steps:

(1) preparing silica particles by powdering and sieving high purity silica glass or sieving synthetic silica, such as that made from $SiCl_4$; and (2) dispersing the silica particles into a thermosetting resin, wherein the resin may comprise, for example, 30% by weight of the total weight of the dispersion.

A method for synthesizing silica by hydrolysis of alkoxysilane is also known.

Such a conventional packing material and a method for making it have the following disadvantages due to the fact that the silica particles are simply mixed and dispersed into the thermosetting resin:

(i) Since the thermal conductivity of the packing material is mostly determined by the filler particles, i.e., determined by the thermal conductivity of amorphous silica, to improve the thermal conductivity of the overall material is difficult.

(ii) As a result of (i), the conventional packing material cannot be sufficiently effective for more complex or larger electronic devices which generate more heat when used.

Accordingly, there is a need for an improved packing material which provides improved thermal conductivity.

SUMMARY OF THE INVENTION

It is an object of the present invention to provide a packing material having improved thermal conductivity, which may be useful, e.g., for sealing an electronic device.

It is another object of the present invention to provide a method for making such a packing material having improved thermal conductivity.

According to the present invention, the packing material comprises a thermosetting resin and a filler particle dispersed in the thermosetting resin. The filler particle comprises a core inorganic particle having an average diameter of from about 0.1 μm to about 200 μm and a thermal conductivity higher than that of amorphous silica. The core inorganic particle is coated with an amorphous silica coating having a thickness of from about 0.01% to about 1% of the core inorganic particle diameter.

The present invention also provides a method for making a packing material comprising a thermosetting resin, e.g., for sealing electronic device. The method comprises the steps of:

(a) providing a core inorganic particle having a diameter of from about 0.1 μm to about 200 μm and having a thermal conductivity higher than that of amorphous silica;

(b) forming on the surface of the core particle an amorphous silica coating having a thickness of from about 0.01% to about 1% of the diameter the core particle, by the steps of (i) dispersing the core particle into alkoxysilane solution;

(ii) hydrolyzing the alkoxysilane so as to form a hydrolyzed alkoxysilane product which coats the surface of the core particle, thereby providing a coated core particle; and (iii) firing the coated core particle so as to form a filler particle comprising the core particle having an amorphous silica coating thereon; and (c) dispersing the filler particle into thermosetting resin.

The present invention further provides an electronic device at least partially sealed in a packing material in accordance with this invention.

BRIEF DESCRIPTION OF THE DRAWINGS

The invention is described in reference to the following detailed description taken in conjunction with the drawings in which.

DETAILED DESCRIPTION OF THE PREFERRED EMBODIMENTS

A preferred embodiment of the packing material according to the present invention will be described with reference to the drawings.

Figure 1:
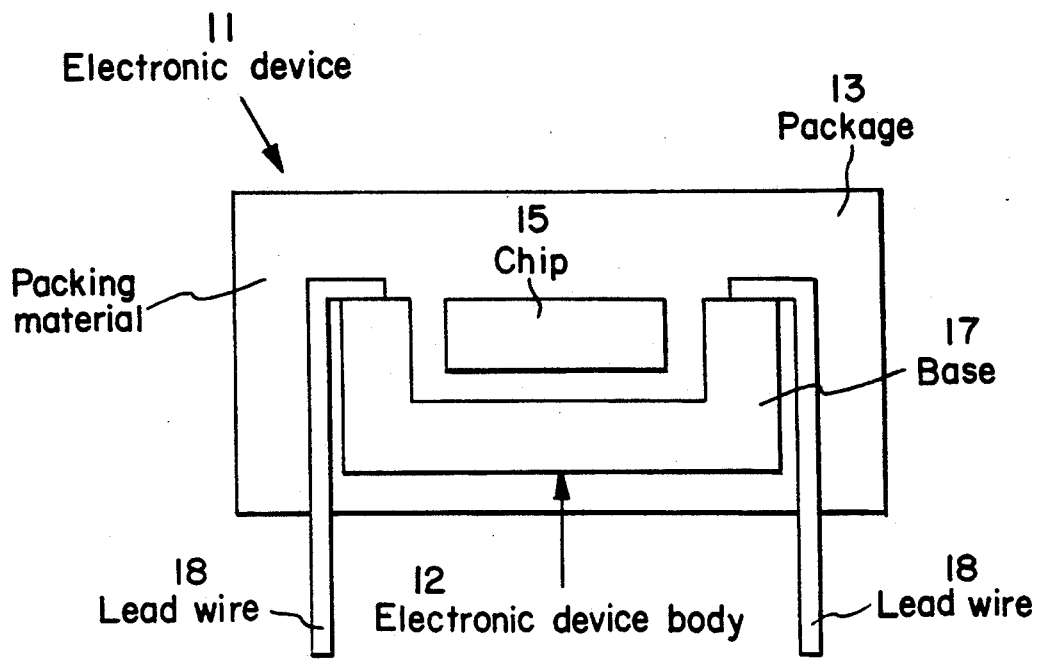
FIG. 1 is a sectional view showing a ordinary electronic device sealed with a packing material.

Referring to FIG. 1, an ordinary electronic device 11 comprises its body 12 and package 13. The body 12 has a base 17 onto which circuit chip 15 is mounted, and lead wire 18. The package 13 is the subject of the present invention. Though the major function of the package 13 is to protect the chip 15, because the package entirely covers the chip, it prevents the transfer of heat away from the chip.

Figure 2:
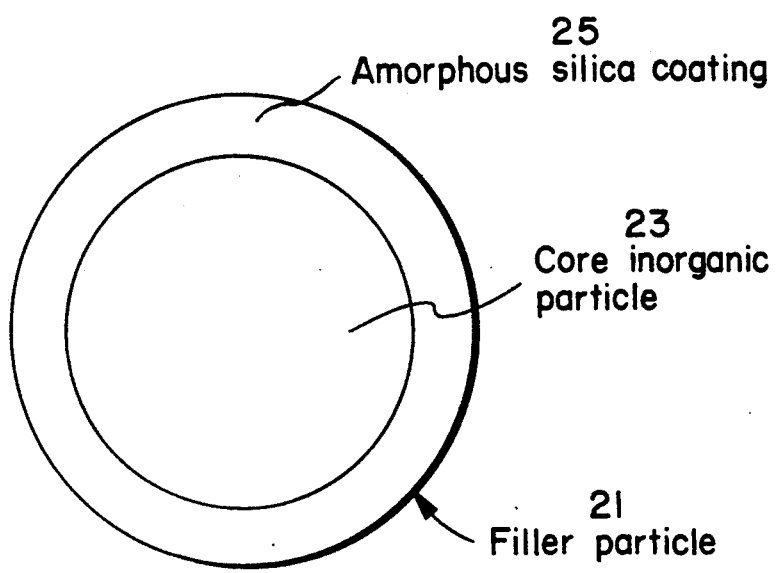
FIG. 2 is a sectional view showing a filler particle including a core particle and an amorphous silica coating according to an embodiment of the present invention.

The packing material according to the present invention has improved thermal conductivity to overcome the above problem. The packing material comprises a thermosetting resin and inorganic filler particles dispersed to the resin. In accordance with this invention, a filler particle 21, which is shown in FIG. 2, has a core inorganic particle 13 having a thermal conductivity higher than that of amorphous silica. The filler particle further comprises an amorphous silica coating 25 on the surface of the core inorganic particle 23. Preferably, crystalline silicon dioxide, metal nitride or metal oxide is used for the core inorganic particle 23. More specifically, quartz can comprise the crystalline silicon dioxide; silicon nitride, aluminum nitride, boron nitride or zirconium nitride can comprise the metal nitride; and aluminum oxide, magnesium oxide, zirconium oxide or beryllium oxide can comprise the metal oxide, respectively, as preferred materials of core inorganic particle 23. Core inorganic particles can comprise one of the foregoing materials or a mixture of two or more of the foregoing materials.

The core inorganic particle 23 has an average diameter of from about 0.1 $\mu$m to about 200 $\mu$m, preferably from about 10 $\mu$m to about 50 $\mu$m, and more preferably from about 20 $\mu$m to about 40 $\mu$m. The particle 23 is covered on its surface with amorphous silica coating 25 having a thickness of from about 0.01% to about 1% of the average core inorganic particle diameter. Most preferably, the thickness of the amorphous silica coating is from about 0.02 $\mu$m to about 0.04 $\mu$m, i.e., 0.1% of the diameter of the core inorganic particle which has a diameter of from about 20 $\mu$m to about 40 $\mu$m.

When the diameter of core inorganic particle 23 is in excess of about 200 $\mu$m, sufficient packing density of packing material (after mixing with resin) may not be possible, such that the thermal conductivity and strength of the package 13 will be lowered.

When the diameter of the core inorganic particle is below about 0.1 $\mu$m, the cost to obtain the core inorganic particle will increase the total cost such that it may become economically infeasible. Additionally, after the amorphous silica coating 25 is formed, the thickness of the coating 25 will become too thick relative to the diameter of the core particle 23 considering the thermal emission. Thus, the thermal conductivity of formed filler particle 25 will be lowered.

If the thickness of the amorphous silica coating 25 is less than about 0.01% of the diameter of the core inorganic particle, the affinity of the filler particle for the thermosetting resin is decreased and the fluidity of the packing material is reduced, which causes incomplete sealing.

If the thickness of the amorphous silica coating 25 exceeds about 1% of the diameter of the core inorganic particle 23, the excess silica decreases the thermal conductivity and mechanical strength of the package 13.

A method for manufacturing a packing material, e.g., for sealing an electronic device, according to the invention is explained below.

First, as described above, a core inorganic particle having a thermal conductivity higher than that of amorphous silica and a diameter of from about 0.1 $\mu$m to about 200 $\mu$m is provided. The method of producing such particles is not important to this invention. As also discussed above, preferably, the core inorganic particles comprise at least one compound selected from the group consisting of crystalline silicon dioxide, metal nitride and metal oxide. More preferably, in the foregoing group, the metal nitride is selected from the group consisting of silicon nitride, aluminum nitride, boron nitride and zirconium nitride. Similarly, the metal oxide preferably is selected from the group consisting of aluminum oxide, magnesium oxide, zirconium oxide and beryllium oxide.

The core particle is dispersed, preferably homogeneously, into an alkoxysilane solution, such as tetraethoxysilane. The alkoxysilane solution is subjected to hydrolysis so as to form a hydrolyzed product including hydroxysilane which coats the core inorganic particle. Then the particle coated is subjected to firing so as to form an amorphous silica coating having a thickness of from about 0.01% to about 1% of the diameter of the core inorganic particle. The thickness of the coating can be controlled by controlling the concentration of the alkoxysilane, or by controlling the amount of the core inorganic particles.

The filler particle comprising the core particle and silica coating is dispersed into a thermosetting resin such as an epoxy resin to produce a packing material in accordance with the invention. Because the inorganic core particle is dispersed in the alkoxysilane solution, and then the solution is hydrolyzed, the amorphous silica coating is formed having a substantially uniform thickness.

While the packing material of this invention may be prepared by the foregoing method, skilled artisans may readily appreciate other methods for making the inventive packing material.

The following examples further illustrate preferred embodiments within the scope of the invention, and do not in any manner limit the invention.

EXAMPLE 1

Aluminum nitride powder (100 grams) having an average diameter of 30 $\mu$m is dispersed into 3 liters of a commercially available 30% aqueous solution of tetraethoxysilane, with a stirring rate of 100 times per minute. A mixture of 3 liters of two-tenths normal (0.2N) aqueous solution of ammonia and 4 liters of ethanol was added to the tetraethoxysilane solution at the rate of 0.1 liter per minute so as to cause hydrolysis to occur. Stirring was continued to disperse the aluminum nitride powder uniformly until the mixture was completed. After stopping the stirring, the solution was allowed to stand for one hour at a temperature of 25° C. Then the aluminum nitride powder dispersed in the solution was filtered by ceramic filter, concentrated and rapidly dried with heating. Finally, the dried aluminum nitride powder having a coating of hydrolyzed product was fired in an inert gas atmosphere. As a result of foregoing operation, an amorphous silica coating was formed on the aluminum nitride powder with a thickness of about 0.1% of the average diameter of the aluminum nitride powder (i.e., about 0.03 $\mu$m).

The filler particles comprising aluminum nitride core particles and amorphous silica coating were added into a kneader and mixed with 19 wt % of epoxy resin (ortho-cresol novolak type, brand name: EOCN-1025 manufactured by Nihon Kagaku Kabushiki-Kaisha) and 11 wt % of phenol resin (phenol novolak type, brand name: PSM-4261 manufactured by Gunei Kagaku Kogyo Kabushiki-Kaisha) to form a packing material for sealing an electronic device. The mixture, i.e., packing material, was made into a tablet having a diameter of from about 1 mm to about 2 mm for measuring fluidity and thermal conductivity.

The measurement of the fluidity was carried out with a so called "flow tester." In the measurement, a cylinder of the flow tester was filled with the tablet and heated to 170° C. A constant pressure (from 10 to 50 Kgf/cm$^2$) was applied to the tablet with a piston. The tablet melted in the cylinder and was squeezed out due to the pressure from a die connected to the cylinder. Viscosity of the melt was calculated from the moving speed of the piston and the value was used for evaluating fluidity.

The measurement of thermal conductivity was carried out using a laser flash method. According to the method, thermal conductivity was calculated when a laser was used to irradiate the specimen (tablet), and the generated heat passing through the specimen was measured with thermodetector.

The results of this example and examples 2–15 which follow are shown in Table 1.

EXAMPLE 2

Example 1 was repeated except that silicon nitride powder having an average diameter of 30 μm was used instead of aluminum nitride.

EXAMPLE 3

Example 1 was repeated except that aluminum oxide powder having an average diameter of 30 μm was used instead of aluminum nitride.

EXAMPLE 4

Example 1 was repeated except that crystalline silicon dioxide powder having an average diameter of 30 μm was used instead of aluminum nitride.

EXAMPLE 5

Example 1 was repeated except that crystalline silicon dioxide powder having an average diameter of 20 μm was used instead of aluminum nitride, and the thickness of amorphous silica coating was decreased to about 0.02 μm. The proportion of coating thickness to the diameter of core inorganic particle (in this case, crystalline silicon dioxide) was not changed, that is, 0.1%.

EXAMPLE 6

Example 1 was repeated except that crystalline silicon dioxide powder having an average diameter of 20 μm was used instead of aluminum nitride, and the thickness of amorphous silica coating was decreased to 0.01% of the diameter of the core inorganic particle (in this case, crystalline silicon dioxide), that is, about 0.002 μm.

EXAMPLE 7

Example 1 was repeated except that crystalline silicon dioxide powder having an average diameter of 20 μm was used instead of aluminum nitride, and the thickness of amorphous silica coating was increased to about 1% of the diameter of the core inorganic particle (in this case, crystalline silicon dioxide), that is, about 0.2 μm.

EXAMPLE 8

Comparative

Example 1 was repeated except that crystalline silicon dioxide powder having an average diameter of 20 μm was used instead of aluminum nitride, and the thickness of amorphous silica coating was increased to 10% of the diameter of the core inorganic particle (in this case, crystalline silicon dioxide), that is, about 2.0 μm.

EXAMPLE 9

Comparative

Example 1 was repeated except that crystalline silicon dioxide powder having an average diameter of 20 μm was used instead of aluminum nitride, and the thickness of amorphous silica coating was increased to 100% of the diameter of the core inorganic particle (in this case, crystalline silicon dioxide), that is, about 20 μm.

EXAMPLE 10

Comparative

Example 1 was repeated except that crushed, rough surfaced amorphous silica powder having an average diameter of 30 μm was used instead of aluminum nitride, and the amorphous silica coating was not formed.

EXAMPLE 11

Comparative

Example 10 was repeated except that smooth surfaced globular amorphous silica powder was used instead of crushed, rough surfaced amorphous silica.

EXAMPLE 12

Example 1 was repeated except that crystalline silicon dioxide powder having an average diameter of 100 μm was used instead of aluminum nitride, and the thickness of amorphous silica coating was increased to about 0.3% of the diameter of the core inorganic particle (in this case, crystalline silicon dioxide).

EXAMPLE 13

Example 12 was repeated except that the average diameter of crystalline silicon dioxide powder was increased to about 150 μm, and the thickness of amorphous silica coating was decreased to about 0.2% of the diameter of the core inorganic particle.

EXAMPLE 14

Comparative

Example 12 was repeated except that the average diameter of crystalline silicon dioxide powder was decreased to 0.05 μm, and the thickness of the amorphous silica coating was increased to about 6% of the diameter of the core inorganic particle.

EXAMPLE 15

Comparative

Example 12 was repeated except that the average diameter of crystalline silicon dioxide powder was increased to about 250 μm and the thickness of amorphous silica coating was decreased to about 0.012% of the diameter of the core inorganic particle

TABLE 1

| No. of the example | Core inorganic particle Material | Core inorganic particle Average diameter (μm) | Amorphous silica coating Thickness (μm) | Amorphous silica coating Ratio of thickness to average diameter of core particle (%) | Fluidity | Viscosity of melt (poise) | Thermal conductivity (cal/s.cm.°C.) |
|---|---|---|---|---|---|---|---|
| 1 | AlN | 30 | 0.03 | 0.1 | Good | 330 | $9.0 \times 10^{-2}$ |
| 2 | $Si_3N_4$ | 30 | 0.03 | 0.1 | Good | 295 | $1.4 \times 10^{-2}$ |
| 3 | $Al_2O_3$ | 30 | 0.03 | 0.1 | Good | 310 | $1.1 \times 10^{-2}$ |
| 4 | $SiO_2$*1 | 30 | 0.03 | 0.1 | Good | 290 | $2.0 \times 10^{-3}$ |
| 5 | $SiO_2$*1 | 20 | 0.02 | 0.1 | Good | 320 | $2.2 \times 10^{-3}$ |
| 6 | $SiO_2$*1 | 20 | 0.002 | 0.01 | Good | 300 | $2.1 \times 10^{-3}$ |
| 7 | $SiO_2$*1 | 20 | 0.2 | 1 | Good | 290 | $2.0 \times 10^{-3}$ |
| 8 | $SiO_2$*1 | 20 | 2 | 10 | Good | 270 | $1.8 \times 10^{-3}$ |
| 9 | $SiO_2$*1 | 20 | 20 | 100 | Good | 245 | $1.7 \times 10^{-3}$ |
| 10 | $SiO_2$*2 | 30 | — | — | Good | 285 | $1.6 \times 10^{-3}$ |
| 11 | $SiO_2$*3 | 30 | — | — | Good | 240 | $1.6 \times 10^{-3}$ |
| 12 | $SiO_2$*1 | 100 | 0.03 | 0.3 | Acceptable | 950 | $2.0 \times 10^{-3}$ |
| 13 | $SiO_2$*1 | 150 | 0.03 | 0.2 | Acceptable | 1500 | $2.0 \times 10^{-3}$ |
| 14 | $SiO_2$*1 | 0.05 | 0.003 | 6 | Not Good | 1650 | $2.0 \times 10^{-3}$ |
| 15 | $SiO_2$*1 | 250 | 0.003 | 0.012 | Not Good | 2450 | $2.0 \times 10^{-3}$ |

*1 crystalline silicon dioxide
*2 crushed amorphous silica
*3 globular amorphous silica It is observed that packing material according to the present invention has a higher, i.e., improved, thermal conductivity and an almost equal fluidity (viscosity) compared with conventional materials shown in examples 10 and 11. It is observed, from comparison of examples 1 to 7 and 12 to 15, that the packing material containing filler particles having diameters deviating from the inventive range (i.e., from about 0.1 to about 200 μm) has increased viscosity and poorer fluidity than that of packing material within the inventive range.

The foregoing description has been set forth merely to illustrate the invention and is not intended to be limiting. Since modifications of the described embodiments incorporating the spirit and substance of the invention may occur to persons skilled in the art, the scope of the invention should be construed all variations falling within the appended claims and their equivalents.

We claim:

1. A packing material comprising:
   a thermosetting resin; and
   a filler particle dispersed in the thermosetting resin, the filler particle comprising a core inorganic material consisting essentially of a material selected from the group consisting of crystalline silicon dioxide and silicon nitride, the particle having an average diameter of from about 10 μm to about 50 μm and having a thermal conductivity higher than that of amorphous silica, the core inorganic particle being coated with an amorphous silica coating thereon, the amorphous silica coating having a thickness of from about 0.01% to about 1% of the core inorganic particle diameter.

2. A packing material according to claim 1, wherein the amorphous silica coating is formed by firing a hydrolyzed product of an alkoxysilane.

3. A packing material according to claim 1, wherein the core inorganic particle is crystalline silicon dioxide.

4. A packing material according to claim 3, wherein the average diameter of the core inorganic particle is from about 20 μm to about 40 μm.

5. A packing material according to claim 4, wherein the amorphous coating has a thickness of from about 0.02 μm to about 0.04 μm.

* * * * *